United States Patent [19]

Ikari

[11] 4,229,758
[45] Oct. 21, 1980

[54] PACKAGE FOR SEMICONDUCTOR DEVICES WITH FIRST AND SECOND METAL LAYERS ON THE SUBSTRATE OF SAID PACKAGE

[75] Inventor: Kouji Ikari, Kokubu, Japan

[73] Assignee: Kyoto Ceramic Co., Ltd., Kyoto, Japan

[21] Appl. No.: 10,623

[22] Filed: Feb. 9, 1979

[30] Foreign Application Priority Data

Feb. 8, 1978 [JP] Japan .................. 53/15340[U]

[51] Int. Cl.³ .................. H01L 23/02; H01L 23/12; H01L 39/02
[52] U.S. Cl. .................. 357/74; 357/80; 357/73; 174/52 FP
[58] Field of Search .................. 357/74, 73, 80; 174/52 R, 52 FP

[56] References Cited

U.S. PATENT DOCUMENTS

| 3,501,833 | 3/1970 | Spiegler | 357/74 |
| 3,617,819 | 11/1971 | Boisvert | 357/74 |
| 3,634,600 | 1/1972 | Griffin | 357/74 |
| 3,681,513 | 8/1972 | Hargis | 357/74 |
| 3,697,666 | 10/1972 | Wakley et al. | 357/80 |
| 3,898,594 | 8/1975 | Hochberg et al. | 357/80 |
| 4,032,350 | 6/1977 | Greenstein | 357/80 |
| 4,092,664 | 5/1978 | Davis | 357/80 |
| 4,142,203 | 2/1979 | Dietz | 357/80 |
| 4,145,120 | 3/1979 | Kubota | 357/80 |

*Primary Examiner*—Andrew J. James

[57] ABSTRACT

A package for sealing an MOS type semiconductor element having a die-attach area comprising a first metal layer composed of gold and a second metal layer composed of a metal having a good bondability to aluminum metal, which is electrically connected to the first metal layer.

3 Claims, 3 Drawing Figures

PACKAGE FOR SEMICONDUCTOR DEVICES WITH FIRST AND SECOND METAL LAYERS ON THE SUBSTRATE OF SAID PACKAGE

BACKGROUND OF THE INVENTION

1. Field of the Invention

The present invention relates to a package for sealing a semiconductor element. More particularly, the invention relates to an improvement in a die-attach area of a package for sealing on MOS type semiconductor element.

2. Description of the Prior Art

A metal oxide semiconductor (MOS) is very poor in the voltage resistance and current resistance because the thickness of an insulating film for insulating and protecting MOS integrated circuits is very small.

Accordingly, if static charges are intruded from the outside in the interior of a device including such semiconductor element while the device is being used or transported, breakdown is caused in the insulating film by these static charges, resulting in deterioration of inherent properties of the element or complete breakage of the element, and no normal operation can be expected anymore.

As means for protecting the semiconductor element from breakdown by static charges, there has heretofore been adopted a method in which a common grounding electrode is formed on the element and this common electrode is connected to a grounding terminal.

A conventional package for sealing an MOS type semiconductor element comprises a metal layer 2 composed of gold, which is disposed in the inner bottom portion (the die-attach area) of a substrate 1 composed of a heat resistant insulating substance as shown in FIG. 1. An MOS type semiconductor element 3 is placed on the metal layer 2 and gold silicon eutectic reaction is caused between silicon constituting the element 3 and gold of the metal layer 2 to bond the element 3 tightly to the substrate 1. Respective electrodes of the element 3 are connected to terminals of a lead frame 4 through aluminum fine wires 5. A common grounding electrode of the element 3 is connected to the metal layer 2 through aluminum fine wire 5' for ensuring common grounding, and the metal layer 2 is electrically connected to a grounding terminal of the lead frame 4 through an aluminum fine wire through this connection is not specifically illustrated in the drawing.

After mounting of the semiconductor element the wire bonding, a cap member 6 is bonded on the substrate 1 by a sealing member 7 such as glass or resin, whereby the interior of the package is sealed completely air-tightly.

In case of this conventional package, by the operation of heating the sealing member for attaining air-tight sealing, purple plague is caused in the bonding area between the aluminum fine wire 5' for common grounding and the metal layer 2, and therefore, breakage of the aluminum fine wire or insufficient contact takes place in this bonding area. As a result, the semiconductor device fails to make a normal operation. This is a fatal defect involved in the conventional semiconductor device.

As means for eliminating this defect, there has been proposed a method in which a dummy chip of silicon having an aluminum electrode formed on the top face thereof according to a known technique such as vacuum deposition or spattering is separately mounted on the metal layer 2, the aluminum electrode of this dummy chip is connected to the common grounding electrode of the semiconductor element 3 through an aluminum fine wire and the aluminum electrode is further connected to the grounding terminal of the lead frame through an aluminum fine wire.

According to this method, the aluminum fine wire for common grounding of the semiconductor element 3 is not allowed to have direct contact with gold of the metal layer 2 but is allowed to fall in contact with the aluminum electrode of the dummy chip, and therefore, purple plague is not caused and complete common grounding is possible.

In this method, however, the dummy chip of silicon, which is inherently unnecessary, should be mounted and the troublesome step of fixing this small dummy chip should inevitably be conducted. Further, at the wire bonding step, in order to use a wire bonder, it is necessary to arrange the dummy chip very precisely at a predetermined position. Therefore, this method is not satisfactory in the operation facility and reliability.

As another means for eliminating the above-mentioned defect, there may be considered a method in which a gold fine wire is used instead of the aluminum fine wire for common grounding of the semiconductor element. However, when an ultrasonic wire bonder performing bonding by utilizing frictional heat is used for wire bonding, since gold is soft and slip is caused on the gold fine wire, heat necessary for fusion bonding cannot be obtained and complete bonding cannot be expected. Further, since the gold fine wire is very expensive, there is brought about a disadvantage that the manufacturing cost of the semiconductor device is increased.

It is therefore a primary object of the present invention to provide a package for sealing a metal oxide semiconductor element having a very high reliability, in which occurrence of purple plague by the heating operation at the step of forming air-tight sealing can be completely prevented.

Another object of the present invention is to provide a package for sealing metal oxide semiconductor element, which can be mass-produced at a low cost with good operation facility.

SUMMARY OF THE INVENTION

The package for sealing an MOS type semiconductor element according to the present invention has a die-attach area comprising a first metal layer composed of gold and a second metal layer composed of a metal having a good bondability to aluminum metal, which is electrically connected to the first metal layer. The MOS type semiconductor element is fixed to the first metal layer by gold silicon eutectic reaction and a common grounding electrode of the semiconductor element is electrically connected to a grounding terminal through the second metal layer by an aluminum fine wire.

DETAILED DESCRIPTION OF THE PREFERRED EMBODIMENT

Figure 1:
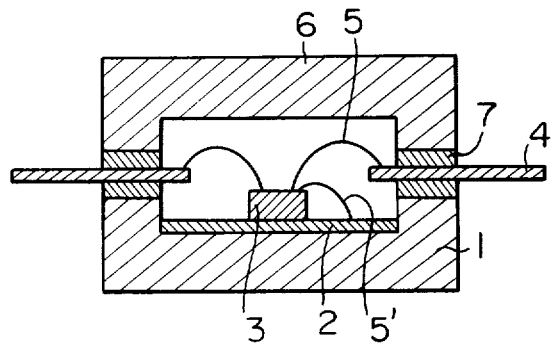
FIG. 1 is a sectional view illustrating a conventional package for sealing an MOS type semiconductor element.
Figure 2:
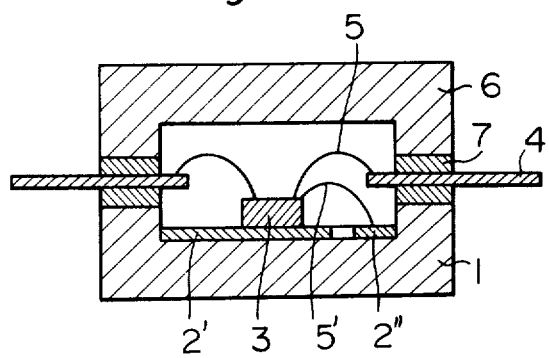
FIG. 2 is a sectional view illustrating a package for sealing an MOS type semiconductor element according to a preferred embodiment of the present invention.
Figure 3:
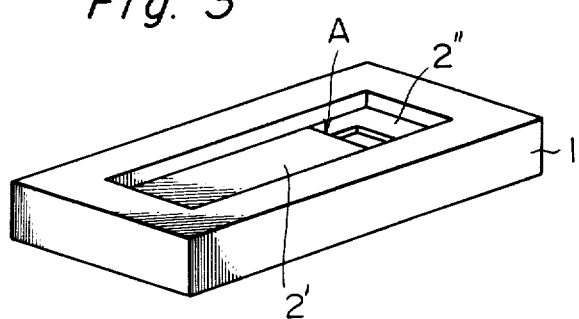
FIG. 3 is a perspective view showing a substrate of the package shown in FIG. 2.

A preferred embodiment of the present invention will now be described in detail by reference to FIGS. 2 and 3, where members same as those of the conventional package are indicated by the same reference numerals as used in FIG. 1.

The package for sealing an MOS type semiconductor element according to the present invention comprises a first metal layer 2' composed of gold disposed in the inner bottom portion (the die-attach area) of a substrate 1 composed of a heat-resistant insulating substance, for example, a ceramic, and a second metal layer 2" composed of a metal having a good bondability to aluminum metal, such as silver (Ag), a mixture of silver (Ag) and platinum (Pt), a mixture of silver (Ag) and palladium (Pd), or a mixture of silver (Ag), palladium (Pd) and platinum (Pt), which is also disposed in the die-attach area of the substrate 1. In this package, both the metal layers 2' and 2" are electrically connected to each other.

These metal layers 2' and 2" are formed, for example, by coating a gold paste and a paste of an Ag-Pd mixture on predetermined areas of the die-attach area of the substrate 1 according to a known coating technique, such as silk screening, and drying the coated pastes at a predetermined temperature. Both the metal layers 2' and 2" are partially overlapped or bonded to each other (See an area A in FIG. 3). These metal layers 2' and 2" may be bonded to each other throughout the end edges thereof or at several points on the end edges thereof.

As in the conventional package, an MOS type semiconductor element 3 is mounted on the first metal layer 2' composed of gold, and by causing eutectic reaction silicon constituting the element 3 and gold of the first metal layer 2', the semiconductor element 3 is tightly bonded and fixed to the substrate 1. Respective electrodes of the element 3 are connected to terminals of a lead frame 4 composed of Kover through aluminum fine wires 5.

In the present invention, the common grounding electrode of the element 3 is connected to the second metal layer 2" on the substrate 1 through an aluminum fine wire 5' by means of, for example, an ultrasonic wire bonder. Further, according to similar procedures, the second metal layer 2" is connected to a grounding terminal of the lead frame 4 through an aluminum fine wire, though this connection is not specifically shown in the drawing.

After completion of connection of the respective electrodes of the element 3 to respective terminals of the lead frame 4 and common grounding of the element 3, a cap member 6 composed of a ceramic is fixed onto the substrate through the lead frame 4 by a sealing 7 composed of, for example, low-melting-point glass, whereby a semiconductor device having the interior thereof sealed completely air-tightly is formed.

As will be apparent from the foregoing illustration, in the novel package for sealing an MOS type semiconductor element according to the present invention, since a metal layer composed of gold is arranged on the area where the semiconductor element 3 is mounted, the advantage of the conventional technique that the semiconductor element can be tightly bonded to the substrate by eutectic reaction is not lost at all, and since a metal layer composed of Ag, an Ag-Pt mixture, an Ag-Pd mixture or an Ag-Pd-Pt mixture is disposed on the area to which an aluminum fine wire for common grounding of the semiconductor element is connected, good bondability to aluminum is attained and occurrence of purple plague by the heating operation at the sealing step can be prevented. As a result, a semiconductor device having a very reliability can be obtained.

Further, in the present invention, a dummy chip need not be formed or expensive gold fine wire need not be used, and therefore, a package for sealing an MOS type semiconductor element which is excellent in adaptability to the mass production can be prepared at a low cost with good operation facility.

As will be apparent from the foregoing illustration, in the package for sealing an MOS semiconductor element according to the present invention, the structure of the die-attach area on which the semiconductor element is mounted is important and critical, and the present invention is not limited by other structure features of the package.

While the invention has been shown and described with reference to a preferred embodiment thereof, it will be obvious to those skilled in the art that various changes and modifications may be made therein without departing from the scope of the invention as defined by the following claims.

What is claimed is:

1. A package for sealing an MOS type semiconductor element having a die-attach area comprising a first metal layer composed of gold and a second metal layer composed of a metal a good bondability to aluminum metal, which is electrically connected to the first metal layer.

2. A package for sealing an MOS type semiconductor element according to claim 1 wherein the MOS type semiconductor element is fixed onto the first metal layer, a common grounding electrode of said semiconductor element is connected to the second metal layer through an aluminum fine wire and common grounding of said semiconductor element is accomplished through the second metal layer.

3. A package for sealing an MOS type semiconductor element according to claim 1, wherein the second metal layer is composed of a metal selected from the group consisting of silver, a silver-platinum mixture, a silver-palladium mixture and a silver-palladium-platinum mixture.

* * * * *